United States Patent
Cheng et al.

(10) Patent No.: US 9,853,633 B1
(45) Date of Patent: Dec. 26, 2017

(54) SYSTEMS AND METHODS INVOLVING LOCK-LOOP CIRCUITS, CLOCK SIGNAL ALIGNMENT, PHASE-AVERAGING FEEDBACK CLOCK CIRCUITRY

(71) Applicant: GSI Technology, Inc., Sunnyvale, CA (US)

(72) Inventors: Yu-Chi Cheng, Sunnyvale, CA (US); Patrick Chuang, Sunnyvale, CA (US); Jae-Hyeong Kim, Sunnyvale, CA (US)

(73) Assignee: GSI TECHNOLOGY, INC., Sunnyvale, CA (US)

( * ) Notice: Subject to any disclaimer, the term of this patent is extended or adjusted under 35 U.S.C. 154(b) by 0 days.

(21) Appl. No.: 15/188,907

(22) Filed: Jun. 21, 2016

Related U.S. Application Data

(60) Provisional application No. 62/183,177, filed on Jun. 22, 2015.

(51) Int. Cl.
  *H03L 7/06* (2006.01)
  *H03K 5/15* (2006.01)
  *H03L 7/081* (2006.01)

(52) U.S. Cl.
  CPC .......... *H03K 5/1506* (2013.01); *H03L 7/0812* (2013.01)

(58) Field of Classification Search
  CPC ................................................. H03K 5/1506
  See application file for complete search history.

(56) References Cited

U.S. PATENT DOCUMENTS

2012/0242382 A1\* 9/2012 Tsuchiya .............. H03L 7/00
  327/153

\* cited by examiner

*Primary Examiner* — Daniel Puentes
(74) *Attorney, Agent, or Firm* — DLA Piper LLP (US)

(57) ABSTRACT

Systems and methods associated with reducing clock skew are disclosed. In some exemplary embodiments, there is provided circuitry associated with lock loop circuits such as a phase lock loop (PLL). Such circuitry may comprise output clock tree circuitry and phase averaging circuitry. In other exemplary embodiments, there is provided circuitry associated with delay lock loop (DLL) circuits. Such circuitry may comprise output clock tree circuitry and/or phase averaging circuitry.

31 Claims, 11 Drawing Sheets

PLL Block Diagram
(PRIOR ART)

PLL with clock tree (M=N=1)
(PRIOR ART)

PLL with multiple clock trees
(PRIOR ART)

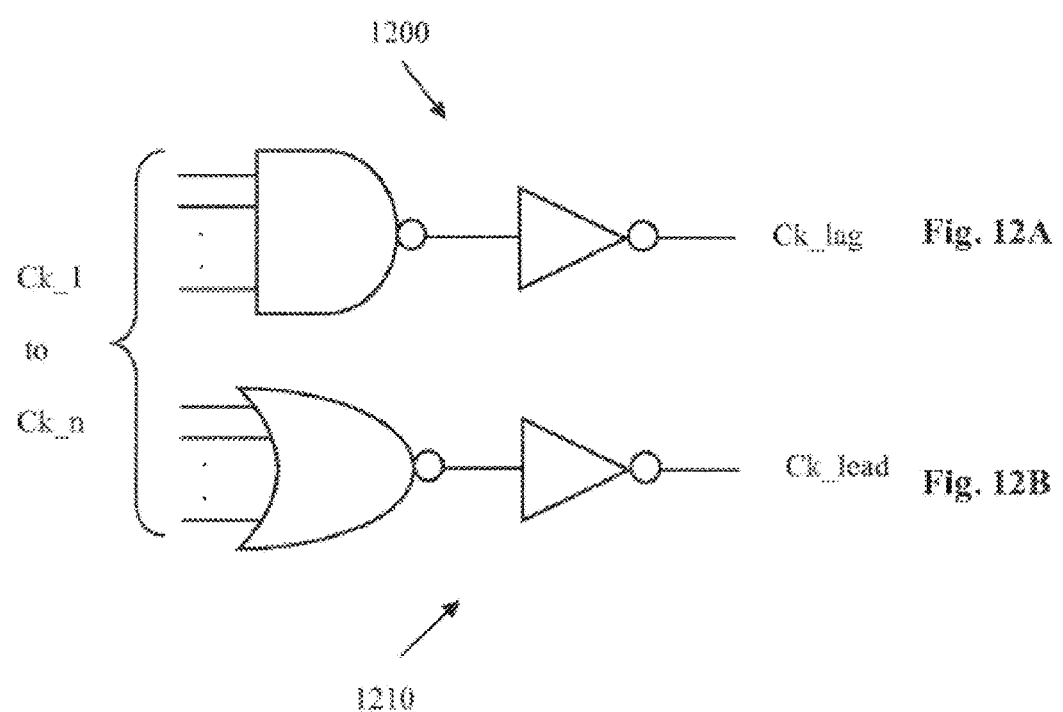

SYSTEMS AND METHODS INVOLVING LOCK-LOOP CIRCUITS, CLOCK SIGNAL ALIGNMENT, PHASE-AVERAGING FEEDBACK CLOCK CIRCUITRY

PRIORITY CLAIMS/RELATED APPLICATIONS

This application claims the benefit under 35 USC 119(e) and priority under 35 USC 120 to U.S. Provisional Patent Application Ser. No. 62/183,177, filed on Jun. 22, 2015 and entitled "Systems And Methods Involving Lock-Loop Circuits, Clock Signal Alignment, Phase-Averaging Feedback Clock Circuitry And/Or Associated Aspects", the entirety of which is incorporated herein by reference.

APPENDIX

Appendix A (1 page) illustrates one implementation of phase averaging circuitry consistent with certain aspects related to the disclosure. Appendix A forms part of the specification and is also incorporated herein by reference.

FIELD

The disclosure relate generally to locked loop circuits, and more specifically, to systems and methods involving a phase-averaging feedback clocks/circuitry.

BACKGROUND

Lock or locked loop circuits, such as phase locked-loop (PLL) and delay locked-loop (DLL) circuitry, are widely used as clock generators for a variety of applications including microprocessors, wireless devices, serial link transceivers, disk drive electronics, and so forth. FIG. 1 illustrates a typical charge pump based PLL circuit 110 that may include phase frequency detector PFD 110, charge pump CP 120, loop filter LPF 130, voltage control oscillator VCO 140, and a divide by M divider 150 and a divide by N divider 152.

The PLL 100 of FIG. 1 has a voltage control oscillator VCO 140 that generates an output clock CKOUT that is frequency locked and phase aligned with an input clock CKIN due to the negative feedback loop. The output clock frequency is defined by the equation CKOUT=CKIN*(N/M), when the PLL 100 is in the lock condition. The inputs chef and ckfb of the phase frequency detector PFD 110 will be phase aligned to each other.

As illustrated in circuit 200 of FIG. 2, a clock tree 220 may be added at the output of the PLL/DLL 210. The output of the clock tree, QK, is required to be phased aligned with CKIN. The input ckfb may be fed back from the QK signal to the PLL/DLL 210 as shown. FIG. 2 is a simplified version of a PLL/DLL with a clock tree where M=1 and N=1.

Next, a known PLL/DLL circuit 300 with a plurality of clock trees 320, 322, 324 is shown in FIG. 3. Since the clock trees 320, 322, 324 are provided at different locations, there will necessarily be skew among the clock trees 320, 322, 324. The clock trees may be designed to minimize the skew between their outputs and the input clock CKIN, but an undesirable amount of skew will still be present. A feedback clock signal, ckfb, is typically derived from one of the clock tree outputs, such as first clock tree output QK_lf in FIG. 3. When the PLL circuit 310 is locked, the input clock CKIN will be phase aligned to the first clock tree output QK_lf. However, since there is skew between first clock tree output QK_lf and second clock tree output QK_rt, the input clock CKIN will not be precisely phase aligned with the second clock tree output QK_rt.

FIG. 4 illustrates clock waveforms of an input clock CKIN, a first clock tree output QK_lf and a second clock tree output QK_rt. FIG. 4 shows a skew between CKIN and QK for a PLL circuit using the second clock tree output QK_rt as a feedback clock.

It should be noted that in FIG. 3, Qk_lf is provided as an input signal for the feedback clock ckfb while Qk_rt is provided as the input signal for the feedback clock ckfb in FIG. 4 in order to illustrate that either of the clock tree outputs Qk_rt, Qk_lf may provide the feedback clock signal.

As set forth below, one or more exemplary aspects of the disclosed circuit and method may overcome such shortcomings and/or otherwise impart innovative aspects by, for example, providing circuitry that reduces skew between an input clock and a plurality of clock tree outputs.

BRIEF DESCRIPTION OF THE DRAWINGS

The accompanying drawings, which constitute a part of this specification, illustrate various implementations and aspects of the disclosure and, together with the description, explain the principles of the disclosure.

FIGS. 12A and 12B illustrate circuit diagrams of yet another exemplary clock selection circuitry.

DETAILED DESCRIPTION OF ONE OR MORE EMBODIMENTS

The disclosure is particularly applicable to clock circuitry 402 that may be used in a memory 400, such as a DRAM or SRAM memory, as shown in FIG. 5 and it is in this context that the disclosure will be described. It will be appreciated, however, that the circuitry and methods have greater utility since the circuitry described below may be used with various clock-related circuitry, such as that within personal computers, servers or server computing devices such as routing/connectivity components, hand-held or laptop devices, multiprocessor systems, microprocessor-based systems, set top boxes, smart phones, consumer electronic devices, network PCs, other existing computer platforms, distributed computing environments that include one or more of the above systems or devices, etc and/or any other device in which it would be desirable to be able to reduce skew between an input clock and a plurality of clock tree outputs.

Systems, methods and circuits consistent with the disclosure herein pertain to locked loop circuits, alignment of related clock signals, feedback and phase alignment circuitry of such signals, and/or associated aspects. Various exemplary implementations herein may include, involve or be configured for coupling with circuitry such as phase locked loop (PLL) circuitry and/or a delay locked loop (DLL) circuitry. Moreover, implementations may include or involve a plurality of clock trees each providing a corresponding clock tree output. Further, phase averaging circuitry may be provided in the feedback clock path, and may perform various selections and/or averaging of the clock tree outputs. Configurations and/or innovations herein reduce skew of an input clock and a clock tree output.

It is to be understood that both the foregoing general description and the following detailed description are exemplary and explanatory only and are not restrictive of the invention, as described. Further features and/or variations may be provided in addition to those set forth herein. For example, the disclosure may be directed to various combinations and subcombinations of the disclosed features and/or combinations and subcombinations of several further features disclosed below in the detailed description.

Reference will now be made in detail to the embodiments disclosed herein, examples of which are illustrated in the accompanying drawings. The implementations set forth in the following description do not represent all implementations consistent with the disclosure. Instead, the embodiments are merely some examples consistent with certain aspects of the disclosure. Wherever possible, the same reference numbers will be used throughout the drawings to refer to the same or like parts.

Figure 5A:
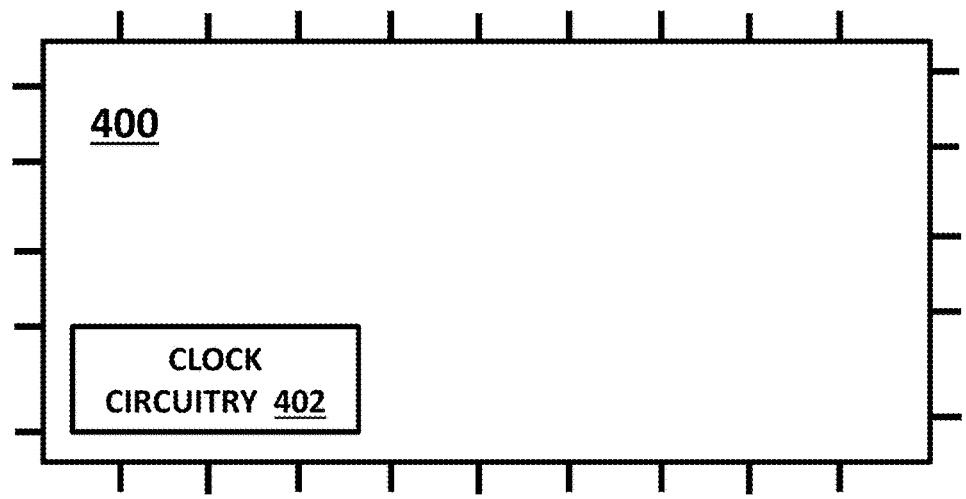
FIG. 5A illustrates a semiconductor memory having a clock circuit that may implement the lock-loop circuits, clock signal alignment, phase-averaging feedback clock circuitry described herein.
Figure 5B:
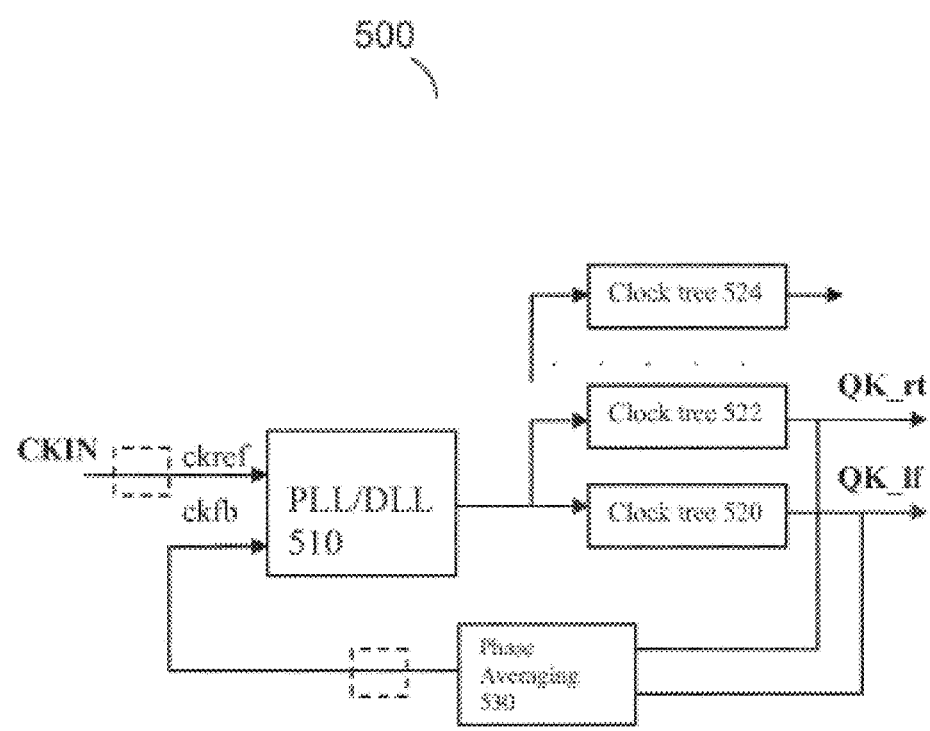
FIG. 5B illustrates a block diagram of an exemplary lock loop circuitry.

FIG. 5B illustrates a block diagram of exemplary lock loop (e.g., PLL/DLL) circuitry 500. In one embodiment, the lock loop circuitry 500 may be part of the clock circuitry 402 of the memory device 400 shown in FIG. 5A. The PLL/DLL circuitry 500 in FIG. 5 minimizes the skew between the input clock CKIN and the one or more clock tree circuits 520, 522, 524 outputs (such as at least QK_rt and QK_lf as shown in FIG. 5B). The circuitry may include known PLL/DLL circuitry 510 that receives the input clock, CKIN, as a chef signal and a feedback clock signal ckfb and whose output is coupled to the one or more clock tree circuits 520-524 which are each well known circuits. Each clock tree circuit 520-524 outputs a signal, such as QK_rt and QK_lf as shown in FIG. 5B, that may be input into phase averaging circuitry 530. The output of the phase averaging circuitry 530 may be fed into the clock feedback signal ckfb of the PLL/DLL circuit 510. An example of an implementation of the phase averaging circuit 530 is described below with reference to FIGS. 7A, 7B and 10.

The phase averaging circuit 530 thus is provided in the PLL feedback clock path and averages the output clock tree clocks, such as QK_lf and QK_rt. The averaged feedback clock ckfb is then phase aligned to the reference clock chef. Examples of the phase averaging circuit 530 implementations are described below with reference to FIGS. 7A-10. Since the input clock CKIN is now phase aligned with the averaging of the clock tree outputs, such as QK_lf and QK_rt in FIG. 5B, the skew of the input clock CKIN to the first clock tree output QK_lf and the skew of the input clock CKIN to the second clock tree output QK_rt are reduced.

Although the implementation shown in FIG. 5B shows only two clock tree output signals being fed into the phase averaging circuit 530, the circuitry may feed more of the clock tree outputs into the phase averaging circuit 530. Furthermore, the circuitry 500 may have more clock tree circuits than shown in FIG. 5B or just two clock tree circuits and the outputs of those clock tree circuits may be input to the phase averaging circuitry 530. In some implementations, the clock circuitry includes phase locked loop circuit or delay locked loop circuit 510 and a plurality of clock trees receiving an output of the PLL/DLL. Furthermore, a phase-averaging feedback clock is provided in a feedback clock path of the PLL/DLL and receives at least two of the clock tree outputs to provide an averaging feedback clock that is input to the PLL/DLL 510 as the feedback clock ckfb. In some implementations, a selection scheme is provided where any two of the clock tree outputs may be selected to be averaged by the phase-averaging circuit 530.

The circuitry in FIG. 5B may be used, for example, as part of the clock circuitry 402 in a semiconductor memory device 400 as shown in FIG. 5A, such as an DRAM or SRAM or other form of computer memory. When used for a semiconductor memory device, the circuitry may be used to generate an output clock that may be used for the clock of the semiconductor memory device. However, the circuitry in FIG. 5B may also be used with any clock circuitry for any electronic device as described above in which it is desirable to be able to reduce skew between an input clock and a plurality of clock tree outputs.

Figure 1:
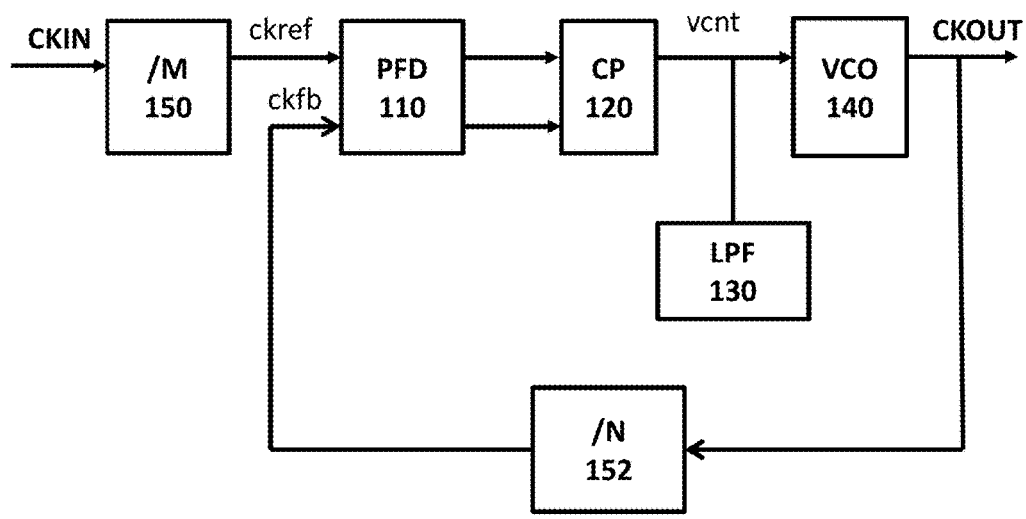
FIG. 1 illustrates a block diagram of a representative PLL circuit known in the art.
Figure 2:
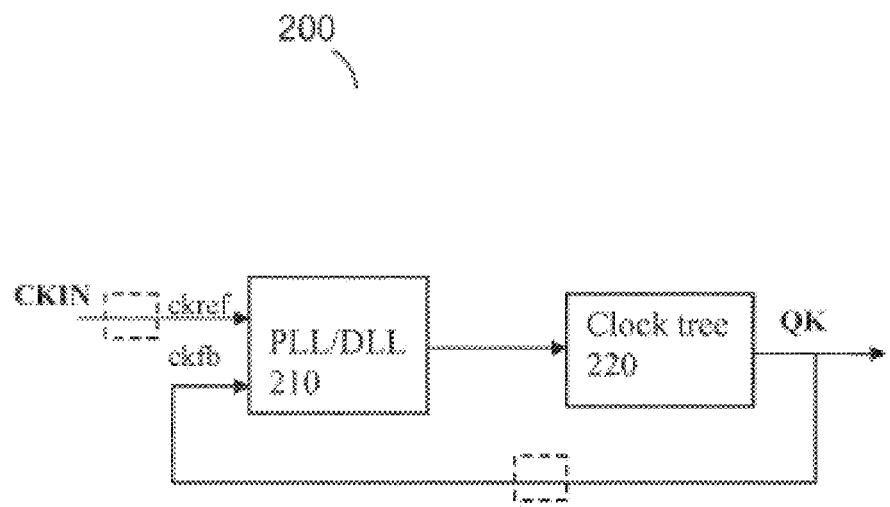
FIG. 2 illustrates a block diagram of a PLL circuit with a clock tree known in the art.
Figure 3:
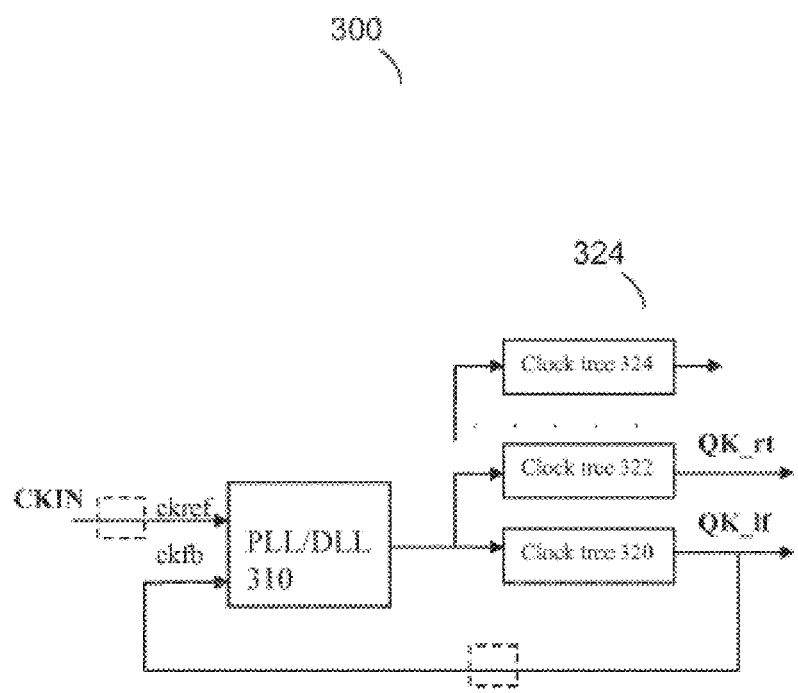
FIG. 3 illustrates another block diagram of a PLL circuit with a plurality of clock trees known in the art.
Figure 4:
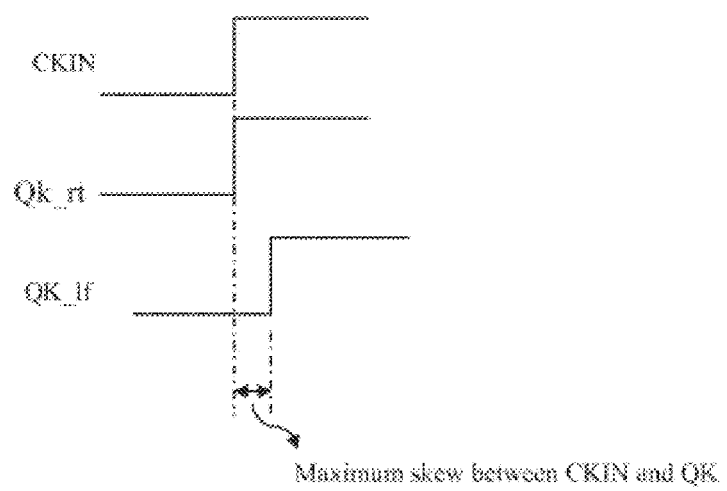
FIG. 4 illustrates waveforms of a PLL circuit with a plurality of clock trees known in the art.
Figure 6:
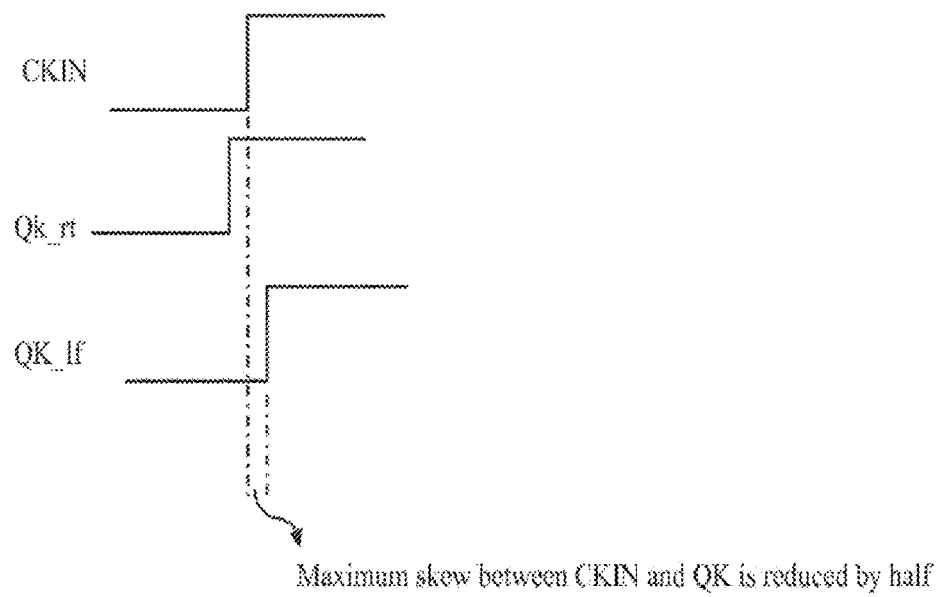
FIG. 6 illustrates waveforms of the exemplary lock loop circuitry of FIG. 5B.

FIG. 6 illustrates waveforms of the exemplary circuit 500 shown in FIG. 5B. In FIG. 6, the circuit with a feedback clock using phase averaging in FIG. 5 reduces the skew between input clock CKIN and QK_If by half compared to the skew illustrated in FIG. 4 of a conventional circuit since the phases of the clock tree outputs are averaged by the phase averaging.

Figure 7A:
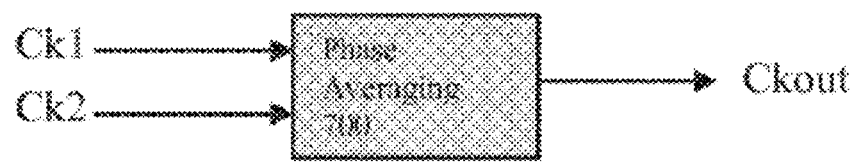
FIGS. 7A and 7B illustrate a block diagram and waveform of exemplary phase averaging circuitry.
Figure 7B:
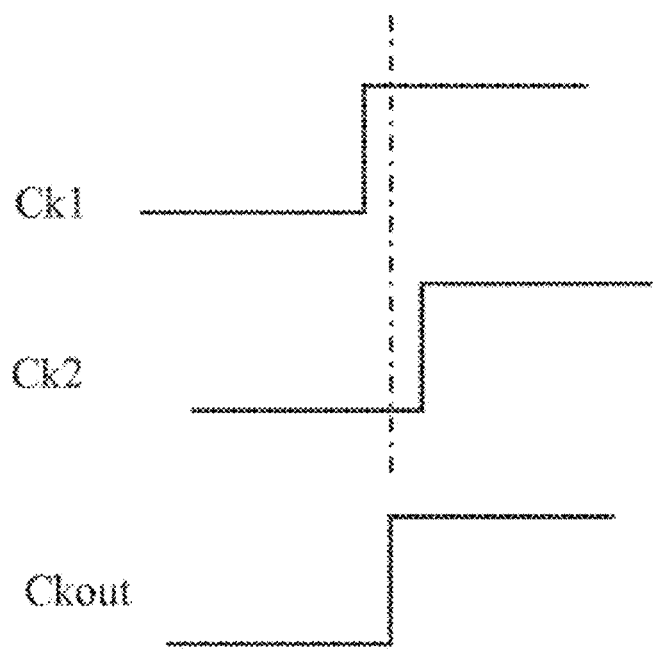

FIGS. 7A and 7B illustrate a block diagram and a waveform of exemplary phase averaging circuitry 700 that may be used for the phase averaging circuitry 530 shown in FIG. 5B. The phase averaging or phase interpolation circuit 700 may receive a set of clock signals Ck1, Ck2 and averages them to produce an output clock signal Ckout. The phase of the output clock signal Ckout is the average of the two inputs clocks Ck1 and Ck2 as shown in FIG. 7B. In some implementations, the weighting of the clock signals may be adjusted to a predetermined number such as 50% from Ck1 and 50% from Ck2. In other implementations, the weighting may be 70% and 30%, or some other combination. In some implementations, the phase averaging circuit may receive three or more clock tree outputs. According to implementations herein, various weighting algorithms may be utilized determine the final phase of the output Ckout.

Figure 10:
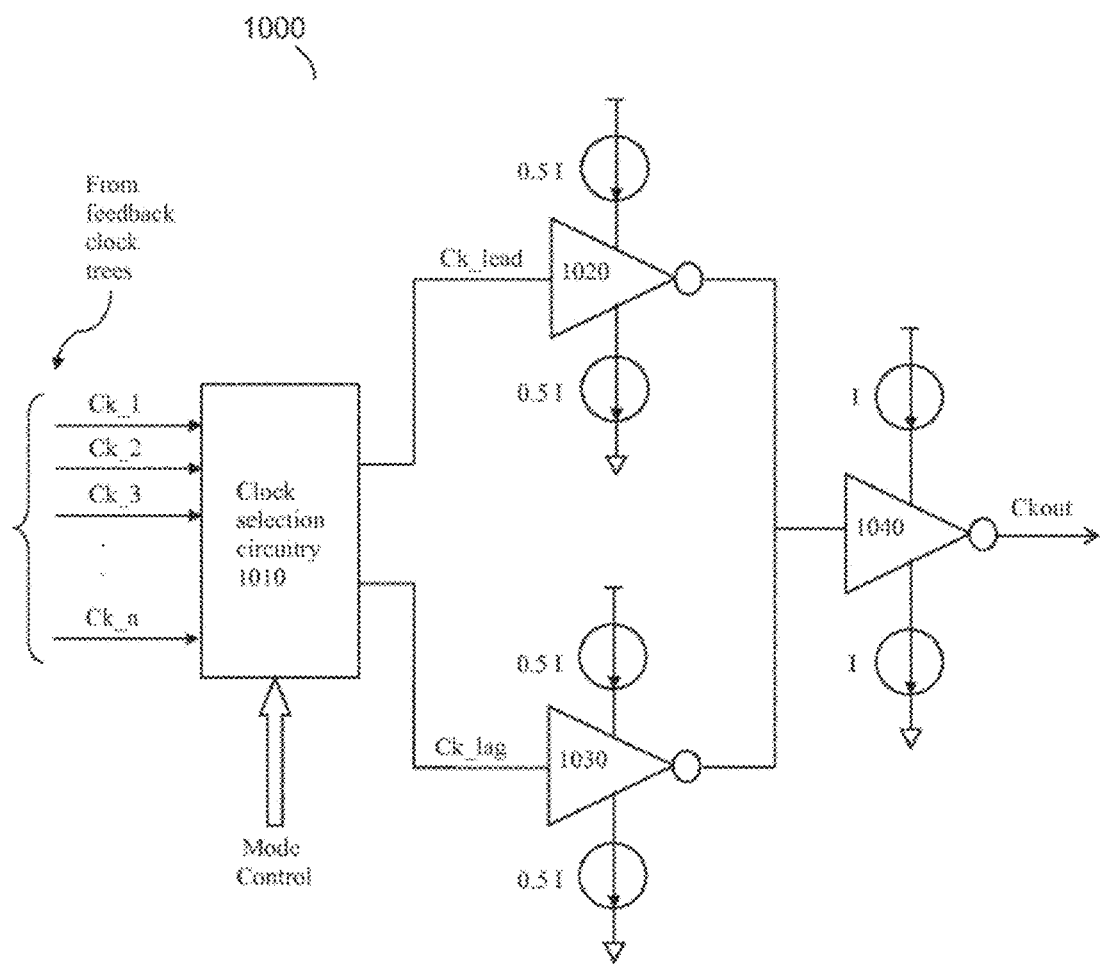
FIG. 10 illustrates a block diagram of another exemplary clock selection circuitry.

An example of an implementation of the phase averaging circuit 700 is shown in FIG. 10 and described below. As shown in FIG. 10, amplifiers 1020, 1030, 1040 are together the phase interopolator for Ck_lead and Ck_lag with 50%-50% weighting scheme. In other embodiments and implementations, other weighting schemes, for example, 3 clock signals Ck1, Ck2, and Ck3, with 33%-33%-34% weighting scheme may be used and the output clock phase will be somewhere in between of CK1,Ck2,Ck3. Another example is 4 clock signals Ck1, Ck2, Ck3, and Ck4 with 25%-25%-25%-25%, equal weighting scheme and the output clock phase will be again somewhere in between of CK1,Ck2, Ck3,Ck4. For these other examples, one skilled in the art would be able to design a similar circuit to that shown in FIG. 10 for the different weighting schemes.

Figure 8A:
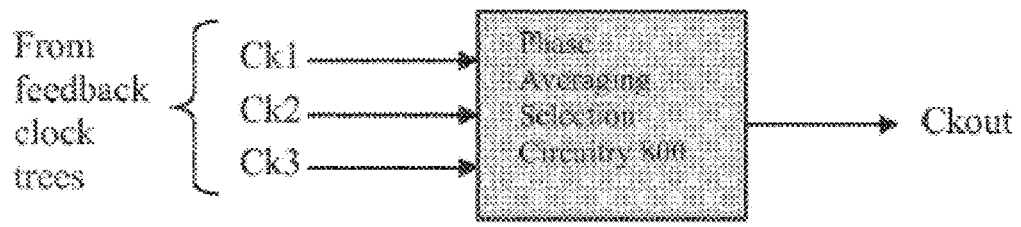
FIGS. 8A and 8B illustrate a block diagram and waveform of exemplary phase averaging circuitry.
Figure 8B:
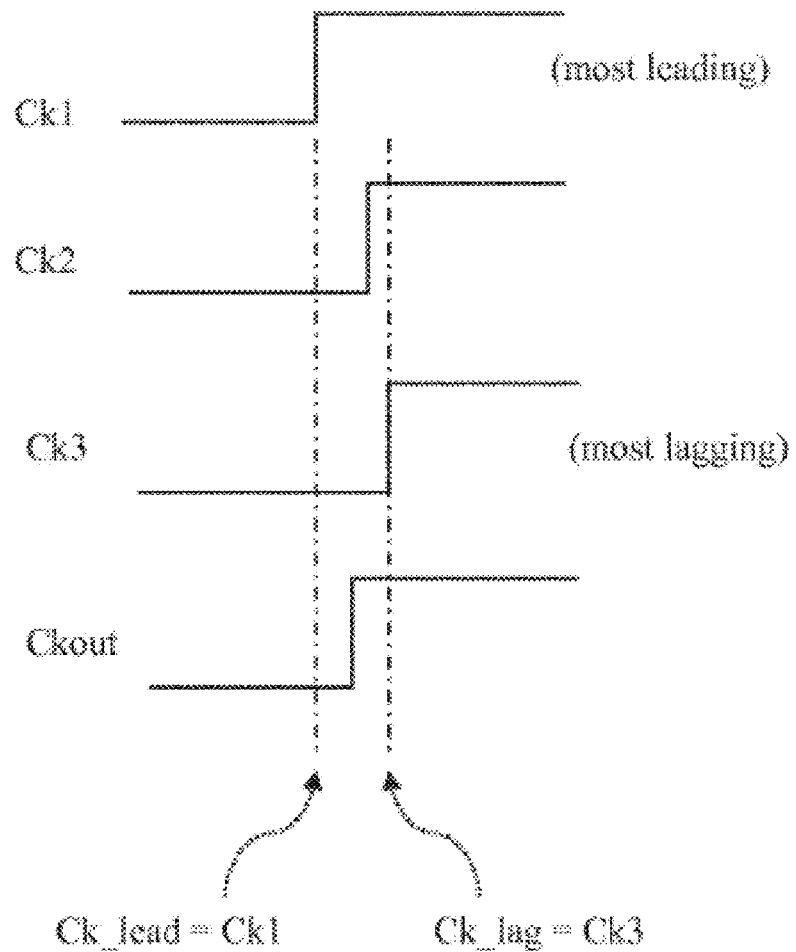

FIGS. 8A and 8B illustrate a block diagram and waveform of an exemplary phase averaging selection circuitry 800 that may be used for the phase averaging circuitry 530 shown in FIG. 5. The phase averaging or phase interpolation selection circuit 800 receives one or more clock signals, such as Ck1, Ck2, Ck3 as shown in the example in FIG. 8A, and selects a most leading clock output, such as Ck1 in the example shown in FIG. 8B, and a most lagging clock output, such as Ck3 in the example shown in FIG. 8B from the one or more clock signals input to the phase averaging selection circuitry 800. In an embodiment in which the phase averaging selection circuitry 800 is used as part of the circuitry 500 in FIG. 5, the input clock signals may be outputs from the clock tree outputs. In one implementation, the circuit shown in FIG. 12A may be used to select the most lagging clock signal and the circuit shown in FIG. 12B may be used to select the most leading clock signal. As shown in FIG. 8B, the most leading clock signal may be the clock signal that transitions at an earliest time relative to the other clock signals and the most lagging clock signal may be the clock signal that transitions at a latest time relative to the other clock signals.

The circuit 800 then averages these two signals (the most leading clock signal and the most lagging clock signal) to produce an output clock signal Ckout. In some implementations, the weighting of the averaging may be adjusted to a predetermined number such as 60% from Ck1 and 40% from Ck3. In other implementations, the weighting may be equal or some other combination. Further, a weighting algorithm may be utilized to determine the final phase of the output Ckout. In the system and circuit, one may use different weighting methods that affect the output clock phase differently. For example, in some cases, the circuitry driven by Ck3 is more critical in term of the timing budget than those driven by Ck1 and the circuit may use a weighting for Ck3 (60% or 70%) that is larger than that from Ck1 (40% or 30%). The effect is that Ckout will be more closer in phase to Ck3 than to Ck1, while if the weighting is 50%-50%, then Ckout will be in the middle and have equal distance to Ck1 and Ck3.

Figure 9:
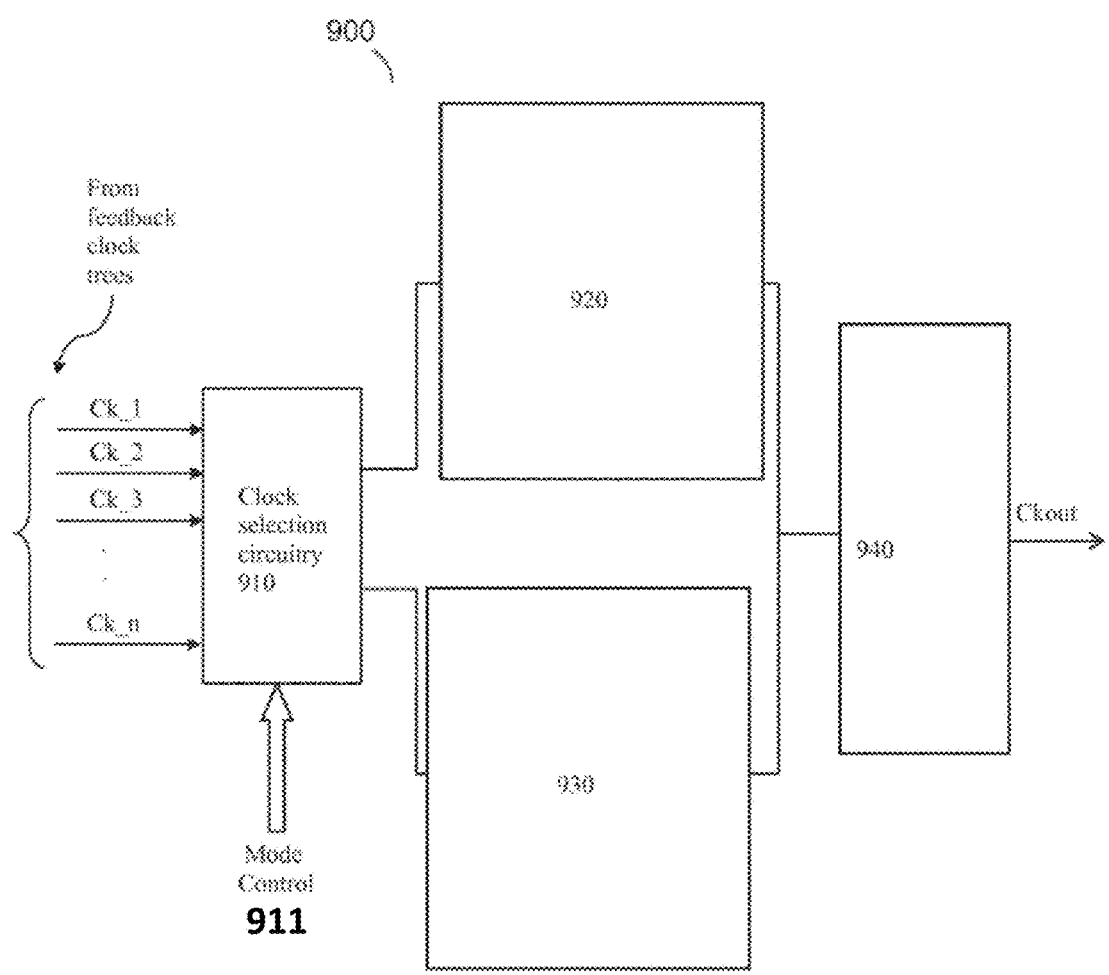
FIG. 9 illustrates a block diagram of exemplary clock selection circuitry.

FIG. 9 illustrates a block diagram of exemplary circuitry 900 that may include phase averaging and clock selection. The circuit 900 in the example in FIG. 9 may include clock selection circuitry 910, leading output signal circuitry 920, lagging output signal circuitry 930 and output circuitry 940. The clock selection circuitry 910 may receive a plurality of clock signals, such as Ck_1, Ck_2, Ck_3 ... Ck_n as shown in FIG. 9. In some implementations, the plurality of clock signals may be outputs from one or more clock tree circuits as shown in FIG. 5. The clock selection circuitry 910 also receives a mode control signal 911 that may select from a plurality of selection and averaging schemes.

The mode signal 911 (that may be n-bits) may determine which clock signal will be used as Ck_lead and which clock signal will be chosen as Ck_lag. In this case, n storage elements, e.g. DFF (D-type Flip-Flop), are needed to store the n-bit mode signals. For example, if n=2, then there will be 4 different modes of selections including: Mode=00 may be the default mode which chooses the most leading clock as Ck_lead, and the most lagging clock as Ck_lag; Mode=01 can choose the 2$^{nd}$ leading clock signal as the Ck_lead, and 2$^{nd}$ lagging clock signal as the Ck_lag. etc. Another example (mode=10), with the 4 clock signals, Ck1, Ck2, Ck3, and Ck4. The circuit may have two levels of phase interpolators. For the first level, the circuit may perform the 50%-50% weighting for Ck1 and Ck2 and output Ck12, and at the same time 50%-50% for Ck3 and Ck4 and output Ck34. Then, at the second level, the circuit performs the 50%-50% for CK12 & CK34 to get the final output Ckout. In this case n storage elements, e.g. DFF (D-type Flip-Flop) are needed to store the n-bit mode signals. So by providing different values for mode signals, the circuit is able to utilize various selection and weighting schemes.

The clock selection circuitry 910 then selects a most leading clock signal and a most lagging clock signal for output to the leading output signal circuitry 920 and the lagging output signal circuitry 930, respectively. The leading output signal circuitry 920 and lagging output signal circuitry 930 may then be weighted according to a predetermined algorithm and then combined into an output signal CKout by the output circuitry 940. An example of the output circuitry is shown in FIG. 10. In the output circuitry 940, the weighting scheme is controlled by the bias current, e.g. 0.51 for Ck_lead INVERETR/BUFFER and 0.51 CK_lag INVERTER/BUFFER, which results in a 50%-50% weighting. The combination circuitry in this case is just a simple wiring together to the input of 1040 INVERTER/BUFFER. For a different weighting scheme, different bias currents would be used to obtain the desired weightings as is known in the art.

It should be noted that the input clock signal CKIN (as shown in FIG. 5) is not input to the clock selection circuitry or averaging circuitry 900. Instead, when the clock selection circuitry or averaging circuitry 900 is used as part of the circuitry 500 in FIG. 5, only the feedback clocks from the clock trees are used to generate the final feedback clock. Conventional systems rely on the input reference clock for use in selection circuitry. These prior approaches require more calculation and manipulation to determine and minimize total skew error, which necessarily requires more circuitry and creates time delay itself. The present innovations discussed herein provide a faster, less costly circuit configuration.

FIG. 10 illustrates a block diagram of an exemplary circuit 1000 that includes clock selection circuitry and phase averaging circuitry. The circuit 1000 may include clock selection circuitry 1010, leading output signal circuitry 1020, lagging output signal circuitry 1030 and output circuitry 1040. The clock selection circuitry 1010 receives a plurality of clock signals, such as Ck_1, Ck_2, Ck_3 ... Ck_n as shown in FIG. 10. In some implementations, the plurality of clock signals may be outputs from one or more clock tree circuits as shown in FIG. 5. The clock selection circuitry 1010 also receives a mode control signal 1011 that may select from a plurality of selection and averaging schemes similar to as described above with respect to FIG. 9. The clock selection circuitry 1010 then selects a most leading clock signal and a most lagging clock signal for output to leading output signal circuitry 1020 and lagging output signal circuitry 1030, respectively in the same manner described above for FIG. 9. In one implementation shown in FIG. 10, the circuitry 1020 and 1030 are weighted equally to provide each respective signal half of the current (0.5 I) and each circuitry 1020, 1030 may be implemented using an operational amplifier. The mode control signal 1011 may provide additional weighting values as described above. The leading output signal circuitry 1020 and lagging output signal circuitry 1030 may then be weighted according to a predetermined algorithm as described above and then combined into an output signal CKout by the output circuitry 1040 that provides a full amount of current I. In one implementation, the output circuitry may also be implemented using an operational amplifier.

Figure 11:
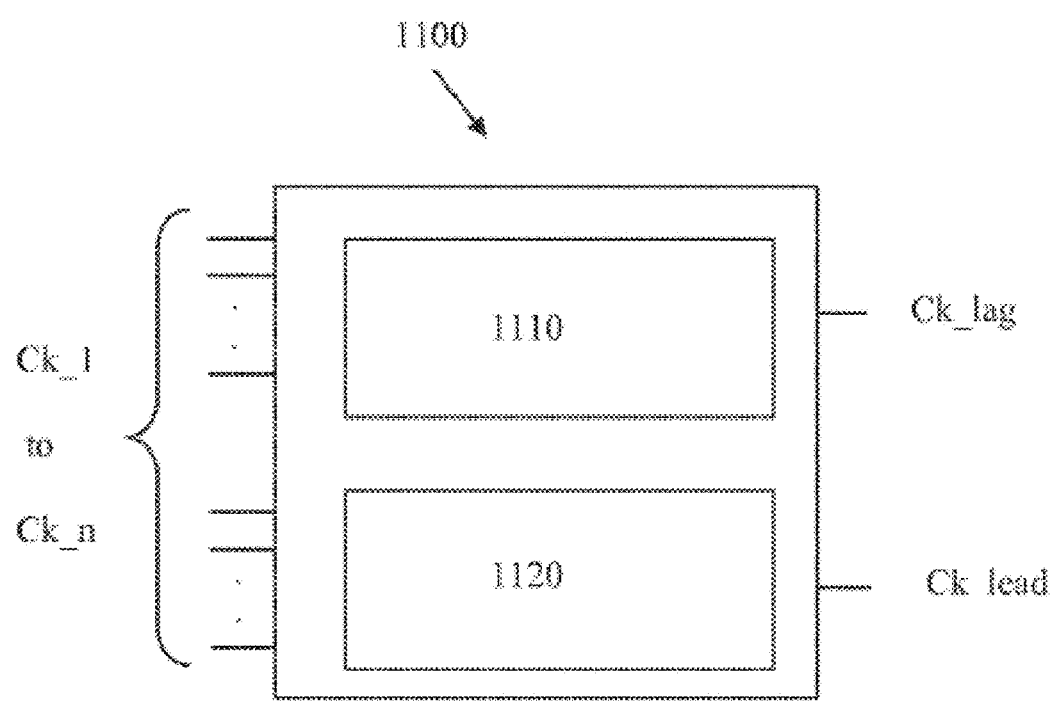
FIG. 11 illustrates a block diagram of yet another exemplary clock selection circuitry.

FIG. 11 illustrates a block diagram of an exemplary clock selection circuit. In particular, FIG. 11 provides one implementation of circuitry 1100 for selecting a most lagging output signal Ck_lag from a plurality of signals and for selecting a most leading output signal Ck_lead from a plurality of signals Ck_n. In some implementations, the plurality of clock signals may be outputs from one or more clock tree circuits as shown in FIG. 5. In FIG. 11, only the most leading clock Ck_lead and the most lagging clock Ck_lag are used to provide an output clock signal Ck_out. Ck_lag is output by most lagging output circuitry 1110 and Ck_lead is output my most leading output circuitry 1120. An example of the circuitry level implementations of the clock selection circuitry is shown in FIGS. 12A and 12B.

FIGS. 12A and 12B illustrate circuit diagrams of an exemplary clock selection circuit. Specifically, FIG. 12A provides an example of an implementation of circuitry 1200 for selecting a most lagging output signal Ck_lag from a plurality of clock signals Ck_n in which the circuitry 1200 may include a multiple input NAND gate 1201 connected to the plurality of clock signals and an inverter 1202 connected to the output of the NAND gate 1201. In operation, the NAND outputs a logical "1" (and the inverter outputs a "0") as each clock signal transitions high until the most lagging clock signal (the last clock signal to transition high) transitions high which causes the NAND circuit 1201 to output a "0" since all of its inputs are now at a high level (a "1") so that the inverter 1202 outputs a "1" indicating a phase/timing of the most lagging clock signal.

The clock selection circuitry may also include circuitry 1210 shown in FIG. 12B for selecting a most leading output signal Ck_lead from a plurality of clock signals Ck_n in which the circuitry 1210 may include a multiple input NOR gate 1211 connected to the plurality of clock signals and an inverter 1212 connected to the output of the NOR gate 1211. In operation, the NOR outputs a logical "0" (and the inverter outputs a "1") when the first of the plurality of clock signals transitions high (a "1") since at least one input of the NOR is high indicating a phase/timing of the most leading clock signal (e.g., the first clock signal of the plurality of clock signals to transition high or to a logical level "1".) In FIGS. 12A and 12B, only the most leading clock signal Ck_lead and the most lagging clock Ck_lag are used to provide an output clock signal Ckout. Appendix A shows an illustrative implementation of innovative phase averaging circuitry. Appendix A provides a specific implementation of a circuit that may correspond to FIG. 9 or FIG. 10, for instance and Appendix A forms part of the specification. The three inverters (with output out_m) in the middle of the circuitry in Appendix A correspond to circuits 1020, 1030, 1040 shown in FIG. 10.

Additionally, the innovations herein may be achieved via implementations with differing or entirely different components, beyond the specific circuitry set forth above. With regard to such other components (e.g., circuitry, computing/processing components, etc.) and/or computer-readable media associated with or embodying the disclosures, for example, aspects of the innovations herein may be implemented consistent with numerous general purpose or special purpose computing systems or configurations. Various exemplary computing systems, environments, and/or configurations that may be suitable for use with the innovations herein may include, but are not limited to, various clock-related circuitry, such as that within personal computers, servers or server computing devices such as routing/connectivity components, hand-held or laptop devices, multiprocessor systems, microprocessor-based systems, set top boxes, smart phones, consumer electronic devices, network PCs, other existing computer platforms, distributed computing environments that include one or more of the above systems or devices, etc.

In some instances, aspects of the innovations herein may be achieved via logic and/or logic instructions including program modules, executed in association with the circuitry, for example. In general, program modules may include routines, programs, objects, components, data structures, etc. that perform particular tasks or implement particular control, delay or instructions. The inventions may also be practiced in the context of distributed circuit settings where circuitry is connected via communication buses, circuitry or links. In distributed settings, control/instructions may occur from both local and remote computer storage media including memory storage devices.

Innovative circuitry and components herein may also include and/or utilize one or more type of computer readable media. Computer readable media can be any available media that is resident on, associable with, or can be accessed by such circuits and/or computing components. By way of example, and not limitation, computer readable media may comprise computer storage media, though does not encompass transitory media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical storage, magnetic tape, magnetic disk storage or other magnetic storage devices, or any other medium which can be used to store the desired information and can accessed by computing component.

In the present description, the terms component, module, device, etc. may refer to any type of non-transitory logical or functional circuits, blocks and/or processes that may be implemented in a variety of ways. For example, the functions of various circuits and/or blocks can be combined with one another into any other number of modules. Each module may even be implemented as a software program stored on a tangible memory (e.g., random access memory, read only memory, CD-ROM memory, hard disk drive) to be read by a central processing unit to implement the functions of the innovations herein. Also, the modules can be implemented as hardware logic circuitry implementing the functions encompassed by the innovations herein. Finally, the modules can be implemented using special purpose instructions (SIMD instructions), field programmable logic arrays or any mix thereof which provides the desired level performance and cost.

As disclosed herein, implementations and features consistent with the disclosures may be implemented through computer-hardware, software and/or firmware. For example, the systems and methods disclosed herein may be embodied in various forms including, for example, a data processor, such as a computer that also includes a database, digital electronic circuitry, firmware, software, or in combinations of them. Moreover, the above-noted features and other aspects and principles of the innovations herein may be implemented in various environments. Such environments and related applications may be specially constructed for performing the various processes and operations according to the invention or they may include a general-purpose computer or computing platform selectively activated or reconfigured by code to provide the necessary functionality.

Aspects of the method and system described herein, such as the logic, may be implemented as functionality programmed into any of a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects include: memory devices, microcontrollers with memory (such as EEPROM), embedded microprocessors, firmware, software, etc. Furthermore, aspects may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

Although certain particular implementations of the invention have been specifically described herein, it will be apparent to those skilled in the art to which the invention pertains that variations and modifications of the various implementations shown and described herein may be made without departing from the spirit and scope of the disclosures. Accordingly, it is intended that the invention be limited only to the extent required by the appended claims and the applicable rules of law.

While the foregoing has been with reference to a particular embodiment of the disclosure, it will be appreciated by those skilled in the art that changes in this embodiment may be made without departing from the principles and spirit of the disclosure, the scope of which is defined by the appended claims.

The invention claimed is:

1. A circuit, comprising
a locked loop circuit;
a plurality of clock tree circuits coupled to an output of the locked loop circuit, each clock tree circuit generating an output signal; and
a phase averaging circuit coupled to the output of at least two of the plurality of clock tree circuits, the phase averaging circuit comprising a selection circuit that selects at least two of the plurality of clock tree circuits for the phase averaging circuit and the phase averaging circuit providing a feedback signal to the locked loop circuit, wherein a maximum skew between the output of each clock tree circuit and an input of the locked loop circuit is reduced.

2. The circuit of claim 1, wherein the phase averaging circuit further comprises a selection circuit that selects at least two of the plurality of clock tree circuits for the phase averaging circuit.

3. The circuit of claim 1, wherein the phase averaging circuit further comprises a selection circuit that selects only two of the plurality of clock tree circuits for the phase averaging circuit.

4. The circuit of claim 2, wherein the selection circuit further comprises a circuit that selects a leading signal from the at least two of the plurality of clock tree circuits and a lagging signal from the at least two of the plurality of clock tree circuits and a circuit that generates the feedback signal by averaging the leading signal and the lagging signal.

5. The circuit of claim 2, wherein the selection circuit further comprises a circuit that selects a most leading signal from the at least two of the plurality of clock tree circuits and a most lagging signal from the at least two of the plurality of clock tree circuits and a circuit that generates the feedback signal by averaging the most leading signal and the most lagging signal.

6. The circuit of claim 5, wherein the circuit that selects a most leading signal and the most lagging signal further comprises a NAND gate for determining the most leading signal and a NOR gate for determining the most lagging signal.

7. The circuit of claim 1, wherein the locked loop circuit is one of a phase locked loop circuit and a delay locked loop circuit.

8. A method for reducing skew in a circuit, comprising:
outputting a plurality of output signals from a plurality of clock tree circuits, the plurality of clock tree circuits coupled to a first circuit;
averaging the plurality of output signals by a phase averaging circuit to generate a feedback signal, wherein averaging the plurality of output signals further comprises selecting a leading output signal from the plurality of clock tree circuits, selecting a lagging output signal from the plurality of clock tree circuits and averaging the leading output signal and the lagging output signal to generate the feedback signal; and
inputting the feedback signal to the first circuit, wherein a maximum skew between the output signals from the plurality of clock tree circuits and an input of the first circuit is reduced.

9. The method of claim 8 further comprising selecting at least two of clock tree circuit outputs for averaging using the phase averaging circuit.

10. The method of claim 8 further comprising selecting only two of clock tree circuit outputs for averaging using the phase averaging circuit.

11. The method of claim 8, wherein an input clock of the first circuit is not inputted to the phase averaging circuit.

12. The method of claim 8, wherein averaging the plurality of output signals further comprises selecting a leading output signal from the plurality of clock tree circuits, selecting a lagging output signal from the plurality of clock tree circuits and averaging the leading output signal and the lagging output signal to generate the feedback signal.

13. The method of claim 12, wherein selecting the leading output signal and the lagging output signal further comprises selecting a most leading output signal from the plurality of clock tree circuits and selecting a most lagging output signal from the plurality of clock tree circuits.

14. The method of claim 12 further comprising determining the most leading output signal using a NAND gate and determining the most lagging output signal using a NOR gate.

15. The method of claim 8, wherein the first circuit is one of a phase locked loop and a delay locked loop.

16. A method of operating a circuit, comprising:
receiving an input clock signal to a first circuit;
receiving an output of the first circuit by a plurality of clock tree circuits;
receiving outputs of the plurality of clock tree circuits by a phase averaging circuit that averages the outputs of the plurality of clock tree circuits to generate an output, wherein averaging the plurality of output signals further comprises selecting a leading output signal from the plurality of clock tree circuits, selecting a lagging output signal from the plurality of clock tree circuits and averaging the leading output signal and the lagging output signal to generate the feedback signal; and
receiving an output of the phase averaging circuit by the first circuit.

17. A semiconductor device, comprising:
a clock circuit that controls a timing of operations within the semiconductor device;
the clock circuit having:
a locked loop circuit;
a plurality of clock tree circuits coupled to an output of the locked loop circuit, each clock tree circuit generating an output signal; and
a phase averaging circuit coupled to the output of at least two of the plurality of clock tree circuits, the phase averaging circuit comprising a selection circuit that selects at least two of the plurality of clock tree circuits for the phase averaging circuit and providing in a feedback signal to the locked loop circuit, wherein a maximum skew between the output of each clock tree circuit and an input of the locked loop circuit is reduced.

18. The circuit of claim 17, wherein the phase averaging circuit further comprises a selection circuit that selects at least two of the plurality of clock tree circuits for the phase averaging circuit.

19. The circuit of claim 17, wherein the phase averaging circuit further comprises a selection circuit that selects only two of the plurality of clock tree circuits for the phase averaging circuit.

20. The circuit of claim 18, wherein the selection circuit further comprises a circuit that selects a leading signal from the at least two of the plurality of clock tree circuits and a lagging signal from the at least two of the plurality of clock tree circuits and a circuit that generates the feedback signal by averaging the leading signal and the lagging signal.

21. The circuit of claim 18, wherein the selection circuit further comprises a circuit that selects a most leading signal from the at least two of the plurality of clock tree circuits and a most lagging signal from the at least two of the plurality of clock tree circuits and a circuit that generates the feedback signal by averaging the most leading signal and the most lagging signal.

22. The circuit of claim 21, wherein the circuit that selects a most leading signal and the most lagging signal further comprises a NAND gate for determining the most leading signal and a NOR gate for determining the most lagging signal.

23. The circuit of claim 17, wherein the locked loop circuit is one of a phase locked loop circuit and a delay locked loop circuit.

24. A method for reducing skew in a semiconductor circuit, comprising:
outputting a plurality of output signals from a plurality of clock tree circuits, the plurality of clock tree circuits coupled to a first circuit;
averaging the plurality of output signals by a phase averaging circuit to generate a feedback signal, wherein averaging the plurality of output signals further comprises selecting a leading output signal from the plurality of clock tree circuits, selecting a lagging output signal from the plurality of clock tree circuits and averaging the leading output signal and the lagging output signal to generate the feedback signal; and
inputting the feedback signal to the first circuit, wherein a maximum skew between the output signals from the plurality of clock tree circuits and an input of the first circuit is reduced.

25. The method of claim 24 further comprising selecting at least two of clock tree circuit outputs for averaging using the phase averaging circuit.

26. The method of claim 24 further comprising selecting only two of clock tree circuit outputs for averaging using the phase averaging circuit.

27. The method of claim 24, wherein an input clock of the first circuit is not inputted to the phase averaging circuit.

28. The method of claim 24, wherein averaging the plurality of output signals further comprises selecting a leading output signal from the plurality of clock tree circuits, selecting a lagging output signal from the plurality of clock tree circuits and averaging the leading output signal and the lagging output signal to generate the feedback signal.

29. The method of claim 28, wherein selecting the leading output signal and the lagging output signal further comprises selecting a most leading output signal from the plurality of clock tree circuits and selecting a most lagging output signal from the plurality of clock tree circuits.

30. The method of claim 28 further comprising determining the most leading output signal using a NAND gate and determining the most lagging output signal using a NOR gate.

31. The method of claim 24, wherein the first circuit is one of a phase locked loop and a delay locked loop.

* * * * *